United States Patent [19]

Mizutani et al.

[11] 3,943,623
[45] Mar. 16, 1976

[54] HOLLOW CAVITY PACKAGE ELECTRONIC UNIT

[75] Inventors: Kazunori Mizutani; Toshihiko Kitaura; Minoru Noo, all of Ibaragi, Japan

[73] Assignee: Nitto Electric Industrial Co., Ltd., Ibaragi, Japan

[22] Filed: Aug. 23, 1974

[21] Appl. No.: 499,955

[52] U.S. Cl. .................. 29/588; 29/589; 156/330; 357/80
[51] Int. Cl.² ........................................ B01J 17/00
[58] Field of Search .......... 29/588, 627, 576 S, 589; 156/330

[56] References Cited
UNITED STATES PATENTS

| | | | |
|---|---|---|---|
| 3,435,516 | 4/1969 | Kilby | 29/588 |
| 3,606,677 | 9/1971 | Ryan | 156/330 |
| 3,768,157 | 10/1973 | Buie | 29/588 |
| 3,810,816 | 5/1974 | Zachariades | 156/330 |

Primary Examiner—W. Tupman
Attorney, Agent, or Firm—Sughrue, Rothwell, Mion & Zinn

[57] ABSTRACT

A method of assembling split, hollow package sections housing an electronic element, having an internal lead wire and having external lead wires extending outwardly therefrom, wherein the package sections are adhesively secured together with external lead wires interposed between the mating surfaces by a fibrous sheet carried by the mating surface of the base portion with the sheet impregnated with a partially-cured plastic polymer.

2 Claims, 1 Drawing Figure

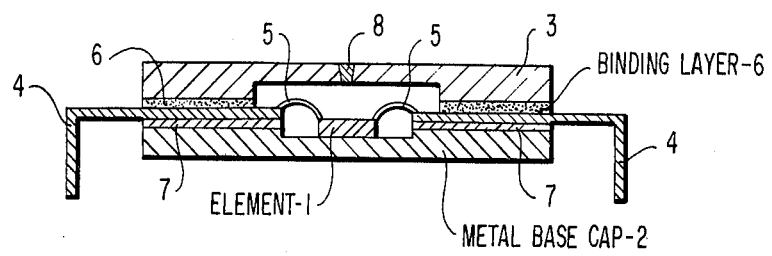

HOLLOW CAVITY PACKAGE ELECTRONIC UNIT

BACKGROUND OF THE INVENTION

1. Field of the Invention

This invention relates to electronic package units and more particularly to an improved method of assembling a hollow cavity plastic package using a simple and reliable sealing arrangement for shielding and protecting a semi-conductor element or semi-conductor integrated circuit element within the cavity, from the ambient atmosphere.

2. Description of the Prior Art

Common to prior art plastic sealing arrangements is the direct mold plastic package system for shielding electronic elements. In such arrangements, the electronic element and the internal lead wire which connects the internal portions of the external lead wires to the electronic element, are completely embedded in a plastic package wall such as epoxide resin polymer, which renders the electronic unit well-suited for mass production.

Such an arrangement, however, creates a number of problems including the inability to provide consistently reliable sealing arrangements particularly with respect to the external leads which protrude outwardly from the internal cavity housing the element as well as the breaking or severing of the internal lead wires caused by residual stresses in the plastic polymer or thermal stresses set up during the heat cycle.

Prior art sealing arrangements which have been employed in an attempt to eliminate the above problems, suggest that the internal lead wires should be completely free within the hollow package. In such sealing systems, which commonly are referred to as hermetically sealed electronic units, the electronic element is mounted within a hollow cavity of the package constructed of ceramic or metal and the ceramic or metal is then sealed by a low melting soldering glass.

The hermetic sealing arrangement does effectively prevent the breaking of the internal lead wires, however, it suffers the serious inherent problem of high cost.

The present invention is directed toward the provision of an improved method of assembling an electronic unit which provides reliable sealing, is well-suited for mass production at costs comparative to that of the direct mold unit, is easy to assemble, and assures consistently reliable operation without encountering any danger of breaking of the internal lead wires.

It has been found that the above objects of the present invention can be achieved by using a specific, improved sealing arrangement between the package and the external lead wires.

SUMMARY OF THE INVENTION

In accordance with the invention, there is provided a plastic package electronic unit which comprises an electronic element, a plurality of internal lead wires connected to the electronic element, a pair of split hollow package sections, at least one including a hollow recess providing a cavity for containing the electronic element and the associated internal lead wires therein, with the package sections being adhesively secured together with a plurality of external lead wires interposed between the mating surfaces of the package sections. The improvement resides in the use of a fibrous sheet impregnated with a partially cured plastic polymer which covers the mating surface of one of the respective package sections, to which the external lead wires are bonded prior to the second package section being bonded thereto.

BRIEF DESCRIPTION OF THE DRAWINGS

The single FIGURE is a cross sectional view of a package electronic unit assembled according to the invention.

DESCRIPTION OF THE PREFERRED EMBODIMENT

Referring to the drawings, the present invention comprises an electronic element, for example, a semiconductor element or a semiconductor integrated circuit element, that is, an IC or LSI circuit element indicated generally at 1. The circuit element 1 is carried within a split package indicated generally at 2 and consisting of an upper split package section 3, which may be constructed of a plastic polymer, such as epoxide resin polymer, and a lower split package section 3' which may be constructed of a metal. The lower package section 3' includes a hollow recess 10 which contains element 1, and the associated internal lead wires such as lead wires 5. The upper package section 3 may include a hollow recess 11 which, together with the recess 10 of the lower section 3' forms the hollow internal cavity permitting the package to hold the element and associated internal circuitry as shown in the figure.

The present invention is directed to the use of an adhesive bonding sheet 7 constructed of fibrous base material impregnated with a partially-cured plastic adhesive polymer and placed respectively on the mating surface of split section 3'. External lead wires 4 which may be carried by a lead frame during manufacture, are bonded to the adhesive sheet 7 with portions extending to the outside of the package and their inner ends in a hollow cavity whereby the internal leads 5 may extend therefrom to the electronic element 1 as shown. Thus, the inner ends of the external lead wires 4 are connected to the internal lead wires 5 which are in turn connected to the element 1 and which are completely free or without any restraint within the hollow cavity. The mating surfaces of the split package sections are then adhesively bonded together by the bonding layer 6 which is a partially-cured plastic polymer powder applied to the mating surface of split section 3.

The base cap 3' is bonded to the cap 3 through the external lead wires 4, the external lead wires having been previously attached to the adhesive sheet 7 which is fixed on the mating portion of the base cap 3'. The bonding portion is compacted through the bonding layer by means of heating and hardening process to make the sealing portion of the package. Therefore, good airtight property can be obtained, and the electrical insulation between the external lead wires and the base cap can be accomplished because the fibrous member is formed in the adhesive sheet. In addition, the adhesive sheet 7 is not adhesive at room temperature since it consists of high molecular epoxy resin, and further the adhesive sheet can be used by easily punching the desired shape of the binding portion of the base cap because the fibrous member is formed therein. It does not matter if the bonding agent is attached to the surface of the element by mistake, as compared with a binding such as liquid molding epoxy resin which has been used in the assembly of known electronic devices since it is not adhesive at room temperature. 8 represents an aperture which is formed in the cap 3. Since a gas enclosed in the cavity expands with heat when the base cap 3' is bonded to the cap 3, unwanted gas may easily be dissipated through the aperture. The aperture 8 may have a diameter of from 0.5–2 mm. After the base cap 3' is bonded to the cap 3, the aperture 8 is filled with liquid molding epoxy resin while heating the package, and is then sealed with the hardened epoxy resin.

Bonding and curing are carried out by heating the split package assembly at a temperature from 120°C. to 160°C. under a pressure of from two to five Kg/cm² which may act on the top of the package and maintain the assembled elements in compression.

The fibrous adhesive sheet 7 may comprise an epoxide prepreg which exists in the non-sticky B-condition at room temperature and which has been formed to a thickness of 0.1 to 0.5 mm by heating a fibrous sheet coated on opposite sides and impregnated with an epoxide polymer composition, dissolved in an organic solvent, if desired, preferably at a temperature of 20°C. to 120°C. These fibrous sheets after such formation are hereinafter referred to merely as the adhesive sheets.

A preferred example of epoxide polymer composition comprises a mixture of bisphenol-A glycydilether epoxide resin polymer having a mean molecular weight ranging from 1500 to 7000 or a combination thereof with a novolak epoxide resin polymer, such as phenol novolak or cresol novolak epoxide resin polymer, with 0.8 to 1.5 equivalents, based on the amount of epoxide radical, of a curing agent comprising one or more aromatic diamines, such as diaminodiphenylmethane and diaminodiphenylsulfon, and other additives such as silicone coupling agent.

It will be understood that various plastic polymers other than epoxide resin polymers, such as unsaturated polyester resin polymers, phenol resin polymers and melamine resin polymers, may impregnate the fibrous base material to form the adhesive sheets.

While the fibrous base sheet material may be formed from various sheet materials such as non-woven polyester fabric, glass paper and Japenese wooden paper, it should be noted that non-woven fabric of organic fiber, such as polyester or polyamide resin fiber, is ideally suitable for that purpose.

The non-woven organic fibrous sheet material can be readily impregnated with plastic polymer composition as described above, while assuring smooth and uniform wetting and impregnation throughout the extent of the non-woven fabric sheet which will result in substantial improvement in the seal at the area of the adhesive sheets when assembled into the electronic unit.

When the adhesive sheet 7 is constructed from a fibrous sheet material impregnated with a thermal setting polymer composition, such as an epoxide resin polymer composition dissolved in a solvent, it is possible to use an epoxide resin polymer having a substantially high molecular weight which is conductive to more desirable properties of adhesive sheets such as non-sticky attitude and easy preservation at room temperature.

Because of the existence of the fibrous base material, adhesive sheets may be kept to the exact outline and configuration of the mating surfaces of the upper and lower package sections or halves which facilitates simple and reliable sealing and assembly of the package, while eliminating all disadvantages associated with the use of a liquid adhesive for bonding and sealing the package sections employed in the prior art.

While the invention has been particularly shown and described with reference to a preferred embodiment thereof, it will be understood by those skilled in the art that various changes in form and details may be made therein without departing from the spirit and scope of the invention.

What is claimed is:

1. A method of fabricating a package for housing an electronic unit in a cavity within said package comprising the steps of::
    a. mounting said electronic unit on a lower portion of said package;
    b. applying a fibrous sheet, selected from the group consisting of non-woven polyester fabric, glass paper and Japanese wooden paper, impregnated with a partially cured plastic polymer to a mating surface of the lower portion, said plastic polymer being selected from the group consisting of epoxide resin polymers, unsaturated polyester resin polymers, pheral resin polymers and melamine resin polymers;
    c. placing the external lead wires onto the fibrous sheet so as to bond them to the lower portion;
    d. connecting internal lead wire between said external lead wires and said electronic unit;
    e. applying a partially cured plastic polymer adhesive to a mating surface of an upper portion of said package, said upper portion having an aperture therein;
    f. bringing the mating surface of the upper portion into contact with a corresponding mating surface on said lower portion;
    g. applying a pressure to said upper and lower portions so as to maintain their contact;
    h. heating said package to fully cure the plastic polymer adhesive; and
    i. sealing said aperture in said upper portion of the package.

2. The method of claim 1 wherein said electronic unit is mounted within a recess formed in said lower portion of said package.

* * * * *